United States Patent
Eroz et al.

(10) Patent No.: US 6,862,706 B2
(45) Date of Patent: Mar. 1, 2005

(54) METHOD FOR A GENERAL NEAR OPTIMAL TURBO CODE TRELLIS TERMINATION

(75) Inventors: Mustafa Eroz, Germantown, MD (US); A. Roger Hammons, Jr., North Potomac, MD (US)

(73) Assignee: Hughes Electronics Corp., El Segundo, CA (US)

( * ) Notice: Subject to any disclaimer, the term of this patent is extended or adjusted under 35 U.S.C. 154(b) by 57 days.

(21) Appl. No.: 10/023,509

(22) Filed: Dec. 18, 2001

(65) Prior Publication Data

US 2002/0083395 A1 Jun. 27, 2002

Related U.S. Application Data

(63) Continuation of application No. 09/378,625, filed on Aug. 20, 1999, now Pat. No. 6,332,209.
(60) Provisional application No. 60/098,111, filed on Aug. 27, 1998.

(51) Int. Cl.[7] ............................................. H03M 13/29
(52) U.S. Cl. ....................................... 714/755; 714/792
(58) Field of Search ................................ 714/755, 792, 714/790

(56) References Cited

U.S. PATENT DOCUMENTS

| | | | |
|---|---|---|---|
| 5,687,095 A | 11/1997 | Haskell et al. | 348/386.1 |
| 5,721,745 A | 2/1998 | Hladik et al. | 714/755 |
| 5,742,612 A | 4/1998 | Gourgue et al. | 714/701 |
| 5,944,850 A | 8/1999 | Chouly et al. | 714/790 |
| 5,978,414 A | 11/1999 | Nara | 375/225 |
| 5,983,384 A | 11/1999 | Ross | 714/755 |
| 5,996,104 A | 11/1999 | Herzberg | 714/755 |
| 6,023,783 A | 2/2000 | Divsalar et al. | 714/792 |
| 6,088,387 A | 7/2000 | Gelblum et al. | 375/222 |
| 6,094,427 A | 7/2000 | Yi | 370/331 |

(List continued on next page.)

FOREIGN PATENT DOCUMENTS

| | | |
|---|---|---|
| DE | 19520987 A1 | 12/1996 |
| DE | 19520987 A1 * | 12/1996 |
| DE | 19736653 C1 | 12/1998 |
| EP | 0300139 A2 A3 | 1/1989 |
| JP | 2001-512914 | 8/2001 |
| WO | WO 96/37050 A1 | 11/1996 |
| WO | WO 98/48517 A1 | 10/1998 |
| WO | WO9907076 | 2/1999 |
| WO | WO 99/07076 A2 | 2/1999 |

OTHER PUBLICATIONS

Berrou et al., Near Shannon Limit Error—Correcting Code and Decoding: Turbo Codes, May 23, 1993, pp 1064–1070.
Maric, Class of Algebraically Constructed Permutations for Use in Pseudorandom Interleavers, Electronics Letters, vol. 30, No. 17, Aug. 18, 1994, pp 1378–1379.

(List continued on next page.)

*Primary Examiner*—Stephen M. Baker
(74) *Attorney, Agent, or Firm*—John T. Whelen

(57) ABSTRACT

A method of terminating two or more constituent encoders of a turbo encoder employing a turbo code, comprising the step of: generating tail input bits at each of two or more constituent encoders, including deriving the tail input bits from each of the two or more constituent encoders separately from a contents of shift registers within each of the two or more constituent encoders, after an encoding of information bits by the two or more constituent encoders; puncturing one or more tail output bits such that 1/R output tail bits are transmitted for each of a plurality of trellis branches, wherein R is a turbo code rate employed by the turbo encoder during an information bit transmission. In yet another variation, the step of puncturing the tail output bits further comprises the step of: transmitting, during trellis termination, the tail output bits, only if they are sent from an output branch of one of the two or more constituent encoders that are used during information bit transmission.

25 Claims, 1 Drawing Sheet

U.S. PATENT DOCUMENTS

| | | | |
|---|---|---|---|
| 6,289,486 B1 * | 9/2001 | Lee et al. | 714/788 |
| 6,334,197 B1 | 12/2001 | Eroz et al. | 714/701 |
| 6,370,669 B1 | 4/2002 | Eroz et al. | 714/774 |
| 6,430,722 B1 | 8/2002 | Eroz et al. | 714/755 |
| 6,530,059 B1 * | 3/2003 | Crozier et al. | 714/786 |
| 2002/0087923 A1 | 7/2002 | Eroz et al. | 714/702 |
| 2002/0166093 A1 | 11/2002 | Eroz et al. | 714/755 |
| 2003/0041297 A1 | 2/2003 | Eroz et al. | 714/755 |
| 2003/0051205 A1 | 3/2003 | Eroz et al. | 714/792 |

OTHER PUBLICATIONS

Barbulescu et al., "Rate Compatible Turbo Codes," Electronics Letters, vol. 31, No. 7, Mar. 30, 1995, pp 535–536.

Divsalar et al., "Turbo Codes for PCS Applications," Jun. 18, 1995, pp 54–59.

Divsalar et al., "Multiple Turbo Codes," IEEE Proceedings of the Military Communications Conference, San Diego, CA, vol. 1, Nov. 6, 1995, pp 279–285.

Benedetto et al., "Unveiling Turbo Codes: Some Results on Parallel Concatenated Coding Schemes," IEEE Transactions on Information Theory, vol. 4, No. 2, Mar. 1, 1996, pp 409–428.

Benedetto et al., "Design of Parallel Concatenated Convolutional Codes," IEEE Transactions on Communications, vol. 44, No. 5, May 1, 1996, pp 591–600.

Rowitch et al., "Rate Compatible Punctured Turbo (RCPT) Codes in a Hybrid FEC/ARQ System," 1997 IEEE Global Telecommunications Mini–Conference, vol. 4, 1997, pp 55–59.

Chan et al., "An Adaptive Hybrid FEC/ARQ Protocol Using Turbo Codes," 1997 IEEE 6th Int'l Conf. on Universal Personal Communications, Oct.–1997, pp 541–545.

Lee et al., "Turbo Code and Its Performance," TIA TR45.5.4, Dec. 8, 1997.

Reidel, "Symbol–by–Symbol MAP Decoding Algorithm for High–Rate Convolutional Codes That Use Reciporical Dual Codes," IEEE Journal on Selected Areas in Communications, vol. 16, No. 2, Feb. 1, 1998, pp 175–185.

Eroz et al., "RTT Text for Turbo Codes," ETSI SMG2UMTS–L1, Oslow, Norway, Apr. 1, 1998.

Eroz et al., "FER and BER Comparisons of Turbo versus Convolutional Codes," ETSI SMG2UMTS–L1, Paris, France, Apr. 28, 1998.

Acikel et al., "High Rate Turbo Codes for BPSK/QPSK Channels," ICC '98 1998 IEEE Int'l Conf. on Communications, Jun. 7, 1998, vol. 1, pp 422–427.

Lee et al., "Third Generation Wireless Technologies—Expectations and Realities," $9^{th}$ IEEE International Symposium on Personal Indoor and Mobile Radio Communications, Boston, MA, Sep. 8, 1998, vol. 1, pp 79–83.

Ho et al., "Improving the Constituent Codes of Turbo Encoders," IEEE Globecom 1998, The Bridge to Global Integration, Sydney, vol. 6, Nov. 8, 1998, pp 3525–3529.

* cited by examiner

TURBO CODE ENCODER

METHOD FOR A GENERAL NEAR OPTIMAL TURBO CODE TRELLIS TERMINATION

This is a continuation of U.S. patent application Ser. No. 09/378,625 filed on Aug. 20, 1999, now U.S. Pat. No. 6,332,209, the entire contents of which is incorporated herein by reference.

This application claims benefit of U.S. Provisional Application Ser. No. 60/098,111, filed Aug. 27, 1998.

BACKGROUND OF THE INVENTION

The present invention relates to methods for terminating both of the constituent encoders of a turbo code and developing puncturing patterns applicable at a trellis termination stage that ensures the same number of transmitted bits for each trellis stage during the information bit transmission and trellis termination stages.

The process of forward and reverse link turbo encoding and decoding, specifically for Code Division Multiple Access (CDMA) communications channels, is thoroughly described in copending U.S. patent application Ser. No. 09/248,338 of Eroz, et al., for SETS OF RATE-COMPATIBLE UNIVERSAL TURBO CODES NEARLY OPTIMIZED OVER VARIOUS RATES AND INTERLEAVER DELAYS, filed Feb. 11, 1999, and copending U.S. patent application Ser. No. 09/235,582, of Eroz, et al., for FORWARD ERROR CORRECTION SCHEME FOR DATA CHANNELS USING UNIVERSAL TURBO CODE, filed Jan. 22, 1999, both of which are incorporated herein by reference.

In a convolutional encoding scheme, tail bits are inserted after information bits, to zero out all shift registers of an encoder. For feed forward encoders, tail bits are equal to zero. For feedback encoders the value of tail bits depend on the contents of the shift register current values.

A turbo encoder consists of a parallel concatenation of two (2) or more recursive (feedback) convolutional encoders. Because each constituent encoder processes the information bits in a different order due to a turbo interleaver, it is not possible to terminate all constituent encoders by the same tail bits.

A trellis termination method general enough to be used for a set of turbo codes with different code rates as in the third generation CDMA systems is desirable. Included in the desirable general method is a method of puncturing tail bit sequences.

SUMMARY OF THE INVENTION

The present invention advantageously addresses the needs above as well as other needs by providing a method and apparatus for a general Turbo Code trellis termination which may be employed when a turbo encoder operates within a wide range of turbo code rates when transmitting information bits.

In its most general form, the invention can be characterized as a method of terminating two or more constituent encoders of a turbo encoder. The method comprises the steps of: generating tail input bits at each of two or more constituent encoders, including the step of deriving the tail input bits from each of the two or more constituent encoders separately from the contents of shift registers within each of the two or more constituent encoders, after an encoding of information bits by the two or more constituent encoders; and puncturing one or more tail output bits such that 1/R tail output bits are transmitted for each of a plurality of trellis stages, wherein R is a turbo code rate employed by the turbo encoder during the information bit transmission.

In yet another variation, the step of puncturing the one or more tail output bits further comprises the step of: transmitting, during trellis termination, the tail output bits only if they are sent from an output branch of one of the two or more constituent encoders that is used during information bit transmission.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENT

Figure 1:
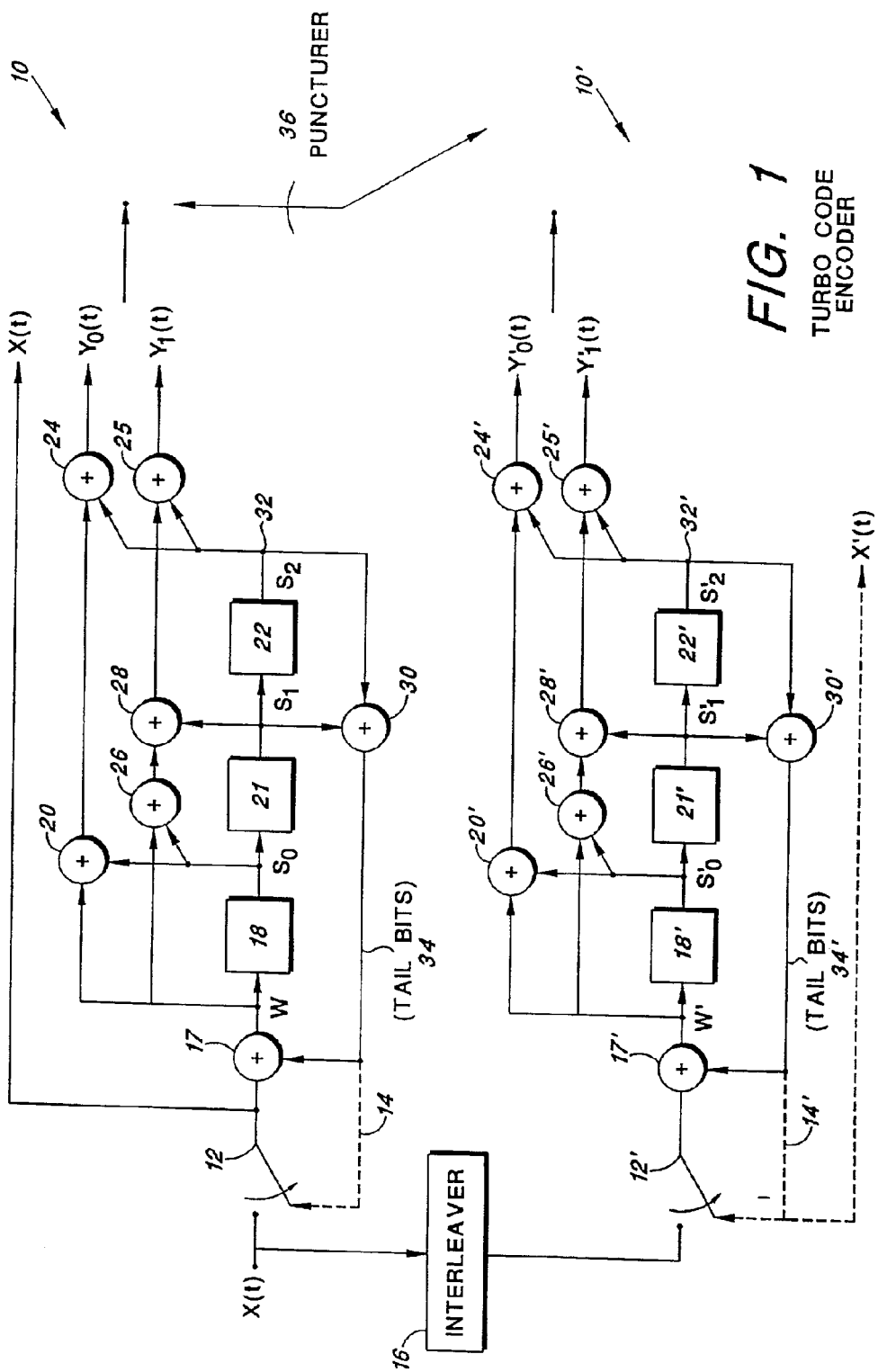
FIG. 1 is a block diagram of a turbo encoder with interleaved bits entering a second encoder, for use in accordance with one embodiment of the present invention.

The following description of the presently contemplated best mode of practicing the invention is not to be taken in a limiting sense, but is made merely for the purpose of describing the general principles of the invention. The scope of the invention should be determined with reference to the claims.

Referring to FIG. 1, an exemplary turbo code encoder is shown wherein one embodiment of a Turbo Code trellis termination design terminates one encoder 10 (a first encoder) while disabling another encoder 10' (a second encoder) and at a different time terminates the other encoder 10' (second encoder) while disabling the encoder 10 (first encoder).

The encoders (first and second encoders) 10, 10' of the turbo code encoder of FIG. 1 are constituent encoders configured in a parallel concatenation. It is well known in the art that a constituent encoder employ a configuration of modular adders 17, 20, 26, 28, 30, 24, and 25, and shift registers 18, 21, 22, coupled through nodes (such as node 32) to produce output bits, including tail output bits, X(t), $Y_0(t)$, $Y_1(t)$, for example, depending upon the encoding scheme. FIG. 1 is just one example of such a parallel concatenation of constituent encoders, wherein an interleaver device (Interleaver) 16 is employed between an input for X(t) and the second encoder 10', and wherein additionally, a puncturer 36 is employed, switchably coupled to respective encoder outputs for each of the encoders (first and second encoders) 10, 10'. As described herein, tail input bits will mean the bits X, and X' in FIG. 1, and tail output bits will mean the bits X, X', $Y_0$, $Y_0'$, $Y_1$ or $Y_1'$. In other turbo encoders, there may be more than two constituent encoders. Each of the constituent encoders may utilize a fewer or greater number of shift registers than in FIG. 1.

In FIG. 1, after message bits X(t) are encoded, a switch 12 is moved to a feedback position to allow the generation of three (3) consecutive tail input bits, in this example, generated from the contents of each of three shift registers 18, 21, and 22 (also referred to herein as a first shift register 18, a second shift register 21, and a third shift register 22). In general, a number of tail input bits X(t), X'(t) for terminating a constituent encoder is equal to a number of shift registers in that encoder.

At the end of each clock cycle, new tail input bits $X(t)$, $X'(t)$ are generated for zeroing out each respective shift register of the three shift registers, 18, 21 and 22.

In one embodiment of the invention the encoders 10, 10' are terminated simultaneously within three clock cycles, each with its own tail input bits $X(t)$, $X'(t)$. Alternatively, the first encoder 10 is first terminated while the second encoder 10' is disabled, followed by the second encoder 10' being terminated while the first encoder 10 is disabled.

In the variation with the encoders 10, 10' terminated at different times the encoders 10, 10' can be terminated in consecutive clock cycles, wherein six (6) consecutive clock cycle tail input bits $X(t)$, $X'(t)$, consecutively terminate both the encoders 10, 10'.

As can be seen from FIG. 1, a second tail input bit sequence 34' for terminating the second encoder 10' is fed back into the second encoder 10' through a switch 12' and circuit 14'. Tail input bits $X(t)$, $X'(t)$ are not interleaved by the turbo interleaver 16. Similarly, a tail input bit sequence 34 for terminating the first encoder 10 is fed back into the first encoder 10 through another switch 12 and another circuit 14.

The zeroing of the shift registers 18, 21, 22, prior to implementing a puncturing scheme per an embodiment of the invention, is triggered by a beginning and an ending tail input bit sequence $X(t)$, $X'(t)$, each sequence having a number n of tail input bits $X(t)$, $X'(t)$ equal to the number n of shift registers 18, 21, 22 or 18', 21, 22 coupled to each one of the encoders 10, 10'.

As with information and coded bits, tail output bits X, $Y_0$, $Y_1$, X', $Y_0'$, $Y_1'$ are also punctured by the puncturer 36.

Table 1 indicates associated tail output bit puncturing patterns having indicator sequences (e.g., "111 000") identifying which bits to puncture and which bits to transmit. The indicator sequence, comprising "1"'s or "0"'s is selected in accordance with an encoder rate. In this notation, "1" indicates the tail output bit should be transmitted and "0" indicates that the tail output should be punctured. Certain entries in Table 1 are labeled "repeat", which means that transmitted bits are transmitted twice.

The tail input bit sequences 34, 34', which comprise tail input bits X, and X', are generated after the encoders 10, 10' encode the information bits with the switches 12, 12' (FIG. 1), while the switches 12, 12' are in an up position. The first n/R tail output bits $X_1$, $Y_0$, $Y_1$, wherein n is the number of shift registers 18, 21, 22 or 18', 21', 22' per constituent encoder (n=3 in FIG. 1), and wherein R is a turbo code rate being employed, are generated by clocking the first encoder 10 n times with its switch 12 in the down position while the second encoder 10' is not clocked, and puncturing or repeating the resulting tail output bits $X_1$, $Y_0$, $Y_1$, X', $Y_0'$, $Y_1'$ according to Table 1 below. The last n/R tail output bits X', $Y_0'$, $Y_1'$ are generated by clocking the second encoder 10' n timer with its switch 12' in the down position while the first encoder 10 is not clocked, and puncturing or repeating the resulting tail output bits according to Table 1. These final output bits are denoted by X', $Y_0'$ or $Y_1'$.

For rate ½ turbo codes, the tail output bits for each of a first n tail input bits (also referred to herein as "the beginning tail bit sequence $X(t)$") are $XY_0$, and the tail output bits for each of a last n tail bit periods (also referred to herein as "the ending tail bit sequence $X'(t)$") are $X'Y_0'$. For rate ⅓ turbo codes, the tail output bits for each of the first n tail input bits are $XXY_0$, and the tail output bits for each of the last n tail bits are $X'X'Y_0'$. For a rate ¼ turbo code, the tail output bits for each of the first n tail input bits are $XXY_0Y_1$ and the tail output bits for each of the last n tail input bit periods are $X'X'Y_0'Y_1'$.

Tail inputs bits are not interleaved by the interleaver 16. They are added after the encoding of the information bits.

TABLE 1

Puncturing Patterns for Tail Output Bits

| Rate | ½ | ⅓ | ¼ |
|---|---|---|---|
| $X(t)$ | 111 000 | 111 000 | 111 000 |
|  |  | Repeat | Repeat |
| $Y_0(t)$ | 111 000 | 111 000 | 111 000 |
| $Y_1(t)$ | 000 000 | 000 000 | 111 000 |
| $X'(t)$ | 000 111 | 000 111 | 000 111 |
|  |  | Repeat | Repeat |
| $Y_0'(t)$ | 000 111 | 000 111 | 000 111 |
| $Y_1'(t)$ | 000 000 | 000 000 | 000 111 |

When employing Table 1 to design puncturing patterns for tail output bits, the row designation "Repeat" means that for a rate ⅓ or a rate ¼ turbo code, when transmitted, the bits X and X' are transmitted twice.

For a rate ½ turbo code, the puncturing table is read first from top to bottom, and then from left to right. For a rate ⅓ turbo code and a rate ¼ turbo code, the puncturing table is read first from top to bottom, repeating $X(t)$ and $X'(t)$, and then from left to right.

The puncturing patterns in Table 1 are chosen so that:

(1) A number of transmitted tail output bits during trellis termination is 1/R for each trellis branch wherein R is the turbo code rate employed during information bit transmission. Advantageously, this condition ensures that the same turbo code rate is used for trellis termination as for information bit transmission.

(2) Only output branches of the encoders 10, 10' used during information bit transmission are used for trellis termination. For example, for rate ½ and rate ⅓ turbo coders, only $X(t)$, $X'(t)$, $Y_0(t)$ and $Y'_0(t)$ are transmitted during information bit transmission; $Y_1(t)$ and $Y'_1(t)$ are always punctured. Therefore, only $X(t)$, $X'(t)$, $Y_0(t)$ and $Y'_0(t)$ are transmitted during the trellis termination stage, as well. Advantageously, therefore, if a manufacturer only wanted to implement a rate ½ and encoder, such a manufacturer would only have to implement transmissions of bits from branches X, $Y_0$ or X', $Y_0'$.

(3) In order to meet conditions (1) and (2), it may require repetition of some tail output bits during trellis termination. That is, to both keep the turbo code rate the same, and to only use output branches used in information bit transmission, it may be necessary to repeat one or more of the tail bits for each encoder 10, 10' in order to keep the turbo code rate the same.

In the preferred embodiment illustrated by Table 1, $X(t)$ and $X'(t)$ are selected to be repeated in both the turbo code rate ⅓ and rate ¼ cases. Table 1 may also be employed irrespective of whether the encoders 10, 10' are terminated concurrently or non-concurrently.

Alternative embodiments are envisioned, in keeping within the spirit of the invention wherein another tail output bit is selected to be repeated, such as, for example that corresponding to $Y_0(t)$ and $Y_0'(t)$.

Alternatively, where a code rate lower than ¼ is employed it may be necessary to repeat more than one tail output bit per encoder 10, 10', in which case an additional tail bit besides $X(t)$ may be repeated, such as repeating $X(t)$ and $Y_0(t)$ or repeating $X(t)$ twice or any combination whatsoever.

While the invention herein disclosed has been described by means of specific embodiments and applications thereof, numerous modifications and variations could be made thereto by those skilled in the art without departing from the scope of the invention set forth in the claims.

What is claimed is:

1. A method for terminating two or more constituent encoders of a turbo encoder employing a turbo code, the method comprising:

generating tail input bits at each of two or more constituent encoders by deriving the tail input bits from each of the two or more constituent encoders separately for each constituent encoder from contents of shift registers within each of the two or more constituent encoders, after an encoding of information bits by the two or more constituent encoders;

transmitting tail output bits from a first X(t) output branch and from a second $Y_0(t)$ output branch during trellis termination of a first of the two or more constituent encoders;

transmitting tail output bits from a third X(t) output branch and from a fourth $Y_0'(t)$ output branch during trellis termination of a second of the two or more constituent encoders; and puncturing one or more tail output bits such that 1/R tail output bits are transmitted for each of a plurality of trellis branches, wherein R is a turbo code rate employed by the turbo encoder during an information bit transmission.

2. A method for terminating two or more constituent encoders of a turbo encoder employing a turbo code, the method comprising:

generating tail input bits at each of two or more constituent encoders by deriving the tail input bits from each of the two or more constituent encoders separately for each constituent encoder from contents of shift registers within each of the two or more constituent encoders, after an encoding of information bits by the two or more constituent encoders; and transmitting tail output bits from certain output branches of said two or more constituent encoders during trellis termination of said two or more constituent encoders, wherein:

when the turbo encoder is employed as a rate ⅓ turbo encoder, said transmitting comprises:

transmitting tail output bits from a first X(t) output branch, and a second $Y_0(t)$ output branch, during trellis termination of a first of the two or more constituent encoders;

re-transmitting tail output bits from the first X(t) output branch during trellis termination of the first of the two or more constituent encoders;

transmitting tail output bits from a third X'(t) output branch and from a fourth $Y_0'(t)$ output branch, during trellis termination of a second of the two or more constituent encoders; and re-transmitting tail output bits from the third X'(t) output branch during trellis termination of the second of the two or more constituent encoders.

3. A method as claimed in claim 2, wherein:

said generating is performed consecutively at each of the two or more constituent encoders, wherein tail input bits from a first constituent encoder are generated at different clock cycles than tail input bits from a second constituent encoder.

4. A method as claimed in claim 2, wherein said generating includes:

puncturing one or more tail output bits such that 1/R tail output bits are transmitted for each of a plurality of trellis branches, wherein R is a turbo code rate employed by the turbo encoder during an information bit transmission.

5. A method as claimed in claim 2, wherein:

said generating is performed simultaneously at each of the two or more constituent encoders, wherein tail input bits from a first constituent encoder are generated in the same clock cycles as tail input bits are generated from a second constituent encoder.

6. A method as claimed in claim 5, wherein:

said generating is performed simultaneously at each of the two or more constituent encoders, wherein tail input bits from a first constituent encoder are generated in the same clock cycles as tail input bits are generated from a second constituent encoder.

7. A method as claimed in claim 5, wherein:

said generating is performed consecutively at each of the two or more constituent encoders, wherein tail input bits from a first constituent encoder are generated at different clock cycles than tail input bits from a second constituent encoder.

8. A method as claimed in claim 5, wherein said generating includes:

puncturing one or more tail output bits such that 1/R tail output bits are transmitted for each of a plurality of trellis branches, wherein R is a turbo code rate employed by the turbo encoder during an information bit transmission.

9. A method for terminating two or more constituent encoders of a turbo encoder employing a turbo code, the method comprising:

generating tail input bits at each of two or more constituent encoders by deriving the tail input bits from each of the two or more constituent encoders separately for each constituent encoder from contents of shift registers within each of the two or more constituent encoders, after an encoding of information bits by the two or more constituent encoders; and transmitting tail output bits from certain output branches of said two or more constituent encoders during trellis termination of said two or more constituent encoders, wherein:

when the turbo encoder is employed as a rate ¼ turbo encoder, said transmitting comprises:

transmitting tail output bits from a first X(t) output branch, a second $Y_0(t)$ output branch, and a third $Y_1(t)$ output branch during trellis termination of a first of the two or more constituent encoders;

re-transmitting tail output bits from the first X(t) output branch during trellis termination of the first of the two or more constituent encoders;

transmitting tail output bits from a fourth X'(t) output branch, a fifth $Y_0'(t)$ output branch, and a sixth $Y_1'(t)$ output branch during trellis termination of a second of the two or more constituent encoders; and re-transmitting tail output bits from the fourth X'(t) output branch during trellis termination of the second of the two or more constituent encoders.

10. A system for terminating two or more constituent encoders of a turbo encoder employing a turbo code, the system comprising:

a generator, adapted to generate tail input bits at each of two or more constituent encoders by deriving the tail input bits from each of the two or more constituent encoders separately for each constituent encoder from contents of shift registers within each of the two or more constituent encoders, after an encoding of information bits by the two or more constituent encoders;

a transmitter, adapted to transmit tail output bits from a first X(t) output branch and from a second $Y_0$(t) output branch during trellis termination of a first of the two or more constituent encoders, and to transmit tail output bits from a third X'(t) output branch and from a fourth $Y_0$'(t) output branch during trellis termination of a second of the two or more constituent encoders; and a puncturer, adapted to puncture one or more tail output bits such that 1/R tail output bits are transmitted for each of a plurality of trellis branches, wherein R is a turbo code rate employed by the turbo encoder during an information bit transmission.

11. A system for terminating two or more constituent encoders of a turbo encoder employing a turbo code, the system comprising:

a generator, adapted to generate tail input bits at each of two or more constituent encoders by deriving the tail input bits from each of the two or more constituent encoders separately for each constituent encoder from contents of shift registers within each of the two or more constituent encoders, after an encoding of information bits by the two or more constituent encoders;

a puncturer, adapted to puncture one or more tail output bits such that 1/R tail output bits are transmitted for each of a plurality of trellis branches, wherein R is a turbo code rate employed by the turbo encoder during an information bit transmission; and a transmitter, adapted to transmit tail output bits from certain output branches of said two or more constituent encoders during trellis termination of said two or more constituent encoders, wherein said transmitter is adapted to perform the following operations:

transmitting tail output bits from a first X(t) output branch and from a second $Y_0$(t) output branch during trellis termination of a first of the two or more constituent encoders; and transmitting tail output bits from a third X'(t) output branch and from a fourth $Y_0$'(t) output branch during trellis termination of a second of the two or more constituent encoders.

12. A system for terminating two or more constituent encoders of a turbo encoder employing a turbo code, the system comprising:

a generator, adapted to generate tail input bits at each of two or more constituent encoders by deriving the tail input bits from each of the two or more constituent encoders separately for each constituent encoder from contents of shift registers within each of the two or more constituent encoders, after an encoding of information bits by the two or more constituent encoders; and a transmitter, adapted to transmit tail output bits from certain output branches of said two or more constituent encoders during trellis termination of said two or more constituent encoders, wherein:

when the turbo encoder is employed as a rate ⅓ turbo encoder, said transmitter is adapted to perform the following operations:

transmitting tail output bits from a first X(t) output branch, and a second $Y_0$(t) output branch, during trellis termination of a first of the two or more constituent encoders;

re-transmitting tail output bits from the first X(t) output branch during trellis termination of the first of the two or more constituent encoders;

transmitting tail output bits from a third X'(t) output branch and from a fourth $Y_0$'(t) output branch, during trellis termination of a second of the two or more constituent encoders; and re-transmitting tail output bits from the third X'(t) output branch during trellis termination of the second of the two or more constituent encoders.

13. A system as claimed in claim 12, wherein:

said generator is adapted to perform said generating simultaneously at each of the two or more constituent encoders, wherein tail input bits from a first constituent encoder are generated in the same clock cycles as tail input bits are generated from a second constituent encoder.

14. A system as claimed in claim 12, wherein:

said generator is adapted to perform said generating consecutively at each of the two or more constituent encoders, wherein tail input bits from a first constituent encoder are generated at different clock cycles than tail input bits from a second constituent encoder.

15. A system as claimed in claim 12, wherein said generator includes:

a puncturer, adapted to puncture one or more tail output bits such that 1/R tail output bits are transmitted for each of a plurality of trellis branches, wherein R is a turbo code rate employed by the turbo encoder during an information bit transmission.

16. A system for terminating two or more constituent encoders of a turbo encoder employing a turbo code, the system comprising:

a generator, adapted to generate tail input bits at each of two or more constituent encoders by deriving the tail input bits from each of the two or more constituent encoders separately for each constituent encoder from contents of shift registers within each of the two or more constituent encoders, after an encoding of information bits by the two or more constituent encoders; and a transmitter, adapted to transmit tail output bits from certain output branches of said two or more constituent encoders during trellis termination of said two or more constituent encoders, wherein:

when the turbo encoder is employed as a rate ¼ turbo encoder, said transmitter performs the following operations:

transmitting tail output bits from a first X(t) output branch, a second $Y_0$(t) output branch, and a third $Y_1$(t) output branch during trellis termination of a first of the two or more constituent encoders;

re-transmitting tail output bits from the first X(t) output branch during trellis termination of the first of the two or more constituent encoders;

transmitting tail output bits from a fourth X'(t) output branch, a fifth $Y_0$'(t) output branch, and a sixth $Y_1$'(t) output branch during trellis termination of a second of the two or more constituent encoders; and re-transmitting tail output bits from the fourth X'(t) output branch during trellis termination of the second of the two or more constituent encoders.

17. A system as claimed in claim 16, wherein:
said generator is adapted to perform said generating simultaneously at each of the two or more constituent encoders, wherein tail input bits from a first constituent encoder are generated in the same clock cycles as tail input bits are generated from a second constituent encoder.

18. A system as claimed in claim 16, wherein:
said generator is adapted to perform said generating consecutively at each of the two or more constituent encoders, wherein tail input bits from a first constituent encoder are generated at different clock cycles than tail input bits from a second constituent encoder.

19. A system as claimed in claim 16, wherein said generator includes:
a puncturer, adapted to puncture one or more tail output bits such that 1/R tail output bits are transmitted for each of a plurality of trellis branches, wherein R is a turbo code rate employed by the turbo encoder during an information bit transmission.

20. A method for terminating two or more constituent encoders of a turbo encoder employing a turbo code, the method comprising:
using the tail input bits from at least one of the two or more constituent encoders after encoding information bits by the two or more constituent encoders; and
generating (nx2)/R tail output bits, n being a number of shift registers in each constituent encoder and R being a turbo code rate, wherein a first subset of said (nx2)/R tail output bits are generated by clocking the first constituent encoder n times with its switch in a down position while the second constituent encoder is not clocked, and a second subset of said (nx2)/R tail output bits are generated by clocking the second constituent encoder n times with its switch in the down position while the first constituent encoder is not clocked.

21. A method of claim 20, wherein said generating includes:
puncturing one or more tail output bits such that 1/R tail output bits are transmitted for each of a plurality of trellis branches.

22. A method of claim 20, where in said generating includes:
puncturing one or more tail output bits as follows:

| Rate | ½ | ⅓ | ¼ |
|---|---|---|---|
| X(t) | 111 000 | 111 000 | 111 000 |
| | | Repeat | Repeat |
| $Y_0(t)$ | 111 000 | 111 000 | 111 000 |
| $Y_1(t)$ | 000 000 | 000 000 | 111 000 |
| X̂(t) | 000 111 | 000 111 | 000 111 |
| | | Repeat | Repeat |
| $Ŷ_0(t)$ | 000 111 | 000 111 | 000 111 |
| $Ŷ_1(t)$ | 000 000 | 000 000 | 000 111. |

23. A method for generating tail output bits to terminate two or more constituent encoders of a turbo encoder employing a turbo code, the method comprising:
using the tail input bits from at least one of the two or more constituent encoders after encoding information bits by the two or more constituent encoders;
generating tail output bits using the tail input bits, wherein R is a turbo code rate; and
puncturing one or more tail output bits such that 1/R tail output bits are transmitted for each of a plurality of trellis branches.

24. A method of claim 23, wherein puncturing one or more tail output bits is as follows:

| Rate | ½ | ⅓ | ¼ |
|---|---|---|---|
| X(t) | 111 000 | 111 000 | 111 000 |
| | | Repeat | Repeat |
| $Y_0(t)$ | 111 000 | 111 000 | 111 000 |
| $Y_1(t)$ | 000 000 | 000 000 | 111 000 |
| X̂(t) | 000 111 | 000 111 | 000 111 |
| | | Repeat | Repeat |
| $Ŷ_0(t)$ | 000 111 | 000 111 | 000 111 |
| $Ŷ_1(t)$ | 000 000 | 000 000 | 000 111. |

25. A wireless telephony apparatus to provide forward error correctable data and operable with a base telephony system to communicate data, the apparatus comprising:
a processor for segmenting data into a data block having a predetermined length;
a turbo code encoder in data communication with the processor for processing the data block, the turbo code encoder comprising two or more constituent encoders, wherein to terminate the data block tail input bits from at least one of the two or more constituent encoders are used after encoding information bits by the two or more constituent encoders, and generating (nx2)/R tail output bits, n being a number of shift registers in each constituent encoder and R being a turbo code rate, wherein a first subset of said (nx2)/R tail output bits are generated by clocking the first constituent encoder n times with its switch in a down position while the second constituent encoder is not clocked, and a second subset of said (nx2)/R tail output bits are generated by clocking the second constituent encoder n times with its switch in the down position while the first constituent encoder is not clocked;
a channel interleaver in data communication with the turbo code encoder to interleave data; and
a transmitter for transmitting interleaved data through an antenna.

* * * * *